(12) United States Patent
MacDonald, Jr. et al.

(10) Patent No.: US 6,570,776 B2
(45) Date of Patent: May 27, 2003

(54) SHIELDED ELECTRONICS PACKAGE STRUCTURE WITH ENHANCED MECHANICAL RELIABILITY

(75) Inventors: James D. MacDonald, Jr., Rockwall, TX (US); Walter M. Marcinkiewicz, Apex, NC (US)

(73) Assignee: Ericsson, Inc., Research Triangle Park, NC (US)

( * ) Notice: Subject to any disclaimer, the term of this patent is extended or adjusted under 35 U.S.C. 154(b) by 0 days.

(21) Appl. No.: 09/884,110

(22) Filed: Jun. 20, 2001

(65) Prior Publication Data

US 2002/0196615 A1 Dec. 26, 2002

(51) Int. Cl.[7] .................................................. H05K 9/00
(52) U.S. Cl. ........................ 361/818; 361/816; 361/800; 174/35; 174/51 R
(58) Field of Search ................................ 361/818, 816, 361/814, 800, 777, 765, 799, 718, 764; 174/35 R, 51 R

(56) References Cited

U.S. PATENT DOCUMENTS

| | | | | |
|---|---|---|---|---|
| 3,752,899 A | * | 8/1973 | Bakker | 174/35 GC |
| 4,518,524 A | * | 5/1985 | Stoetzer | 252/512 |
| 4,809,135 A | * | 2/1989 | Yerman | 174/52.4 |
| 5,255,431 A | * | 10/1993 | Burdick | 29/840 |
| 5,311,059 A | * | 5/1994 | Banerji et al. | 257/659 |
| 5,498,467 A | | 3/1996 | Meola | 428/198 |
| 5,612,576 A | * | 3/1997 | Wilson et al. | 257/788 |
| 5,886,413 A | | 3/1999 | Knott et al. | 257/778 |
| 5,910,524 A | * | 6/1999 | Kalinoski | 427/387 |
| 6,210,789 B1 | | 4/2001 | Hanrahan | 428/324 |
| 6,235,986 B1 | * | 5/2001 | Reis et al. | 174/35 GC |

* cited by examiner

Primary Examiner—David Martin
Assistant Examiner—Hung Bui
(74) Attorney, Agent, or Firm—Harrity & Snyder, L.L.P.

(57) ABSTRACT

A circuit shielding structure includes a circuitry package and a layer of conductive polymer material coating at least a portion of the circuitry package. The layer of conductive polymer material may include a metal filled polymer such as a silver particle filled fluoroelastomer.

15 Claims, 3 Drawing Sheets

SHIELDED ELECTRONICS PACKAGE STRUCTURE WITH ENHANCED MECHANICAL RELIABILITY

BACKGROUND OF THE INVENTION

The present invention relates generally to semiconductor chip packages and, more particularly, to structures for shielding semiconductor chip packages with enhanced mechanical reliability.

Stacked Multichip Modules (MCM's), Chip Scale Packages (CSP's) and Micro Ball Grid Arrays ($\mu$BGA's) are electronic packages that increase the density of packaged silicon by forming a package having a volume only slightly greater than the bare silicon active device. Such packages often employ the stacking of silicon dies or die/interposer structures into a single package for surface mounting on a printed circuit board (PCB). MCM's, CSP's and $\mu$BGA's are formed with silicon dies wirebonded to an organic interposer. The interposer is further connected to the PCB assembly through solder balls. Organic encapsulation is dispensed or molded over the die to provide mechanical and environmental protection for the die/interposer structure.

A conventional MCM, CSP or $\mu$BGA package is generally not significantly shielded against EMI/RFI. Shielding, when it is used, typically consists of placing a MCM, CSP or $\mu$BGA package within a metal outer shell structure. This method of shielding adds considerable volume, weight and complexity to the overall package structure.

BRIEF SUMMARY OF THE INVENTION

Implementations consistent with the present invention provide a shielding structure for a circuitry package, such as a MCM, CSP or $\mu$BGA package, through application of a coating of a metal filled polymer to surface areas of the circuitry package. Additionally, implementations consistent with the present invention may include the placement of an electrically conductive particle filled polymer gasket between the circuitry package and a conductive trace of the PCB. Implementations consistent with the present invention, thus, provide a structure for shielding a circuitry package against EMI/RFI that may enhance the mechanical integrity of the interconnection between the circuitry package and the PCB.

In accordance with the purpose of the invention as embodied and broadly described herein, a circuit shielding structure includes a circuitry package, and a layer of conductive polymer material coating at least a portion of the circuitry package.

In another implementation consistent with the present invention, a structure for interconnecting a circuitry package with a circuit board includes a conductive trace applied to the circuit board, an electrically conductive particle filled polymer gasket, and a circuitry package adhered to the electrically conductive particle filled polymer gasket, wherein the gasket is soldered to the conductive trace such that solder wicks through the gasket to a surface of the circuitry package.

In a further implementation consistent with the present invention, a method of shielding a circuitry package includes applying a layer of conductive polymer material to at least a portion of the circuitry package.

In an additional implementation consistent with the present invention, a method of interconnecting a circuitry package with a circuit board includes applying a conductive trace to the circuit board, adhering the circuitry package to an electrically conductive particle filled polymer gasket, applying solder to the conductive trace, and applying heat to the solder such that the solder wicks from the conductive trace, through the gasket, to a surface of the circuitry package.

BRIEF DESCRIPTION OF THE DRAWINGS

The accompanying drawings, which are incorporated in and constitute a part of this specification, illustrate the invention and, together with the description, explain the invention. In the drawings.

DETAILED DESCRIPTION OF THE INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents.

Implementations consistent with the present invention may provide a shielding structure for a circuitry package, such as a MCM, CSP or $\mu$BGA package, through application of a coating of a metal filled polymer to surface areas of the circuitry package. Implementations consistent with the present invention may further provide an electrically conductive particle filled polymer gasket between the circuitry package and a conductive trace of the PCB, thus, providing a structure for shielding a circuitry package against EMI/RFI that may enhance the mechanical integrity of the interconnection between the circuitry package and the PCB.

Figure 1:
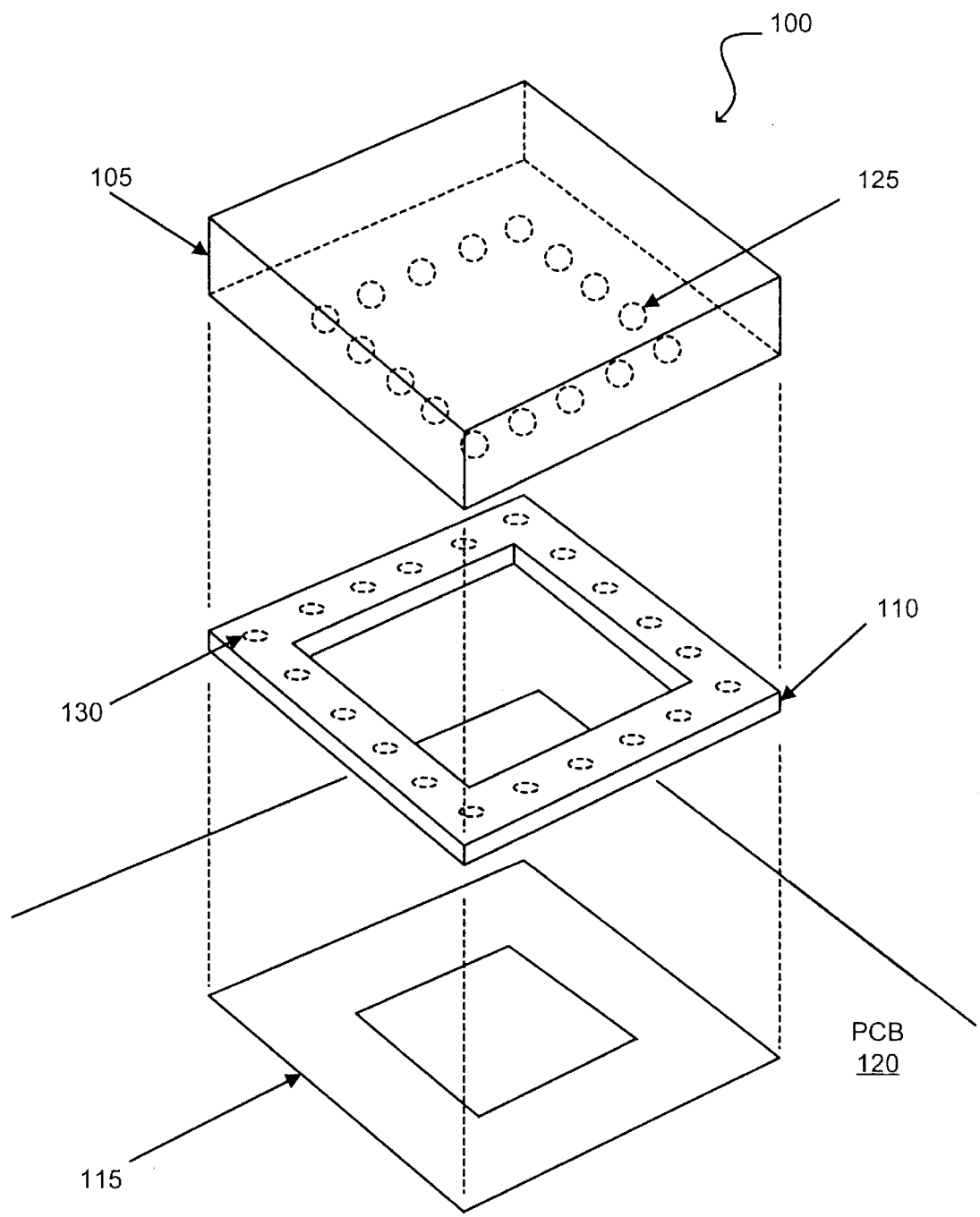
FIG. 1 illustrates an exploded view of an exemplary structure for interconnecting a circuitry package with a circuit board consistent with the present invention.

FIG. 1 illustrates an exemplary structure 100 for interconnecting a circuitry package with a PCB consistent with the present invention. Structure 100 may include a circuitry package 105, a gasket 110, and a conductive trace 115. Structure 100 may be interconnected with a PCB 120. Circuitry package 105 may include a stacked Multichip Module (MCM), a Chip Scale Package (CSP), a Micro Ball Grid Array ($\mu$BGA) or the like, that further may include integrated circuitry implemented in semiconductor dies. Such integrated circuitry may include small, large, or very large scale integration (VLSI). As shown in FIG. 1, structure 100 may use solder balls 125 to support the circuitry package 105 upon conductive trace 115 and PCB 120. Conductive polymer adhesive 130 may be applied to a surface of gasket 110 for adhering gasket 110 to circuitry package 105. For example, the conductive adhesive 130 may be applied in a dot pattern as illustrated in FIG. 1.

Gasket 110 may include an electrically conductive particle filled polymer. The conductive particles may include, but are not limited to, any admixture of silver, nickel, aluminum, copper, stainless steel, graphite, carbon, gold, or platinum particles. The polymer material may include, but is not limited to, polytetrafluoroethylene (PTFE). U.S. Pat. No. 6,210,789 discloses an exemplary conductive particle filled polymer that may be used in an implementation consistent with the present invention. Conductive trace 115 may include a solderable shield border.

Figure 2:
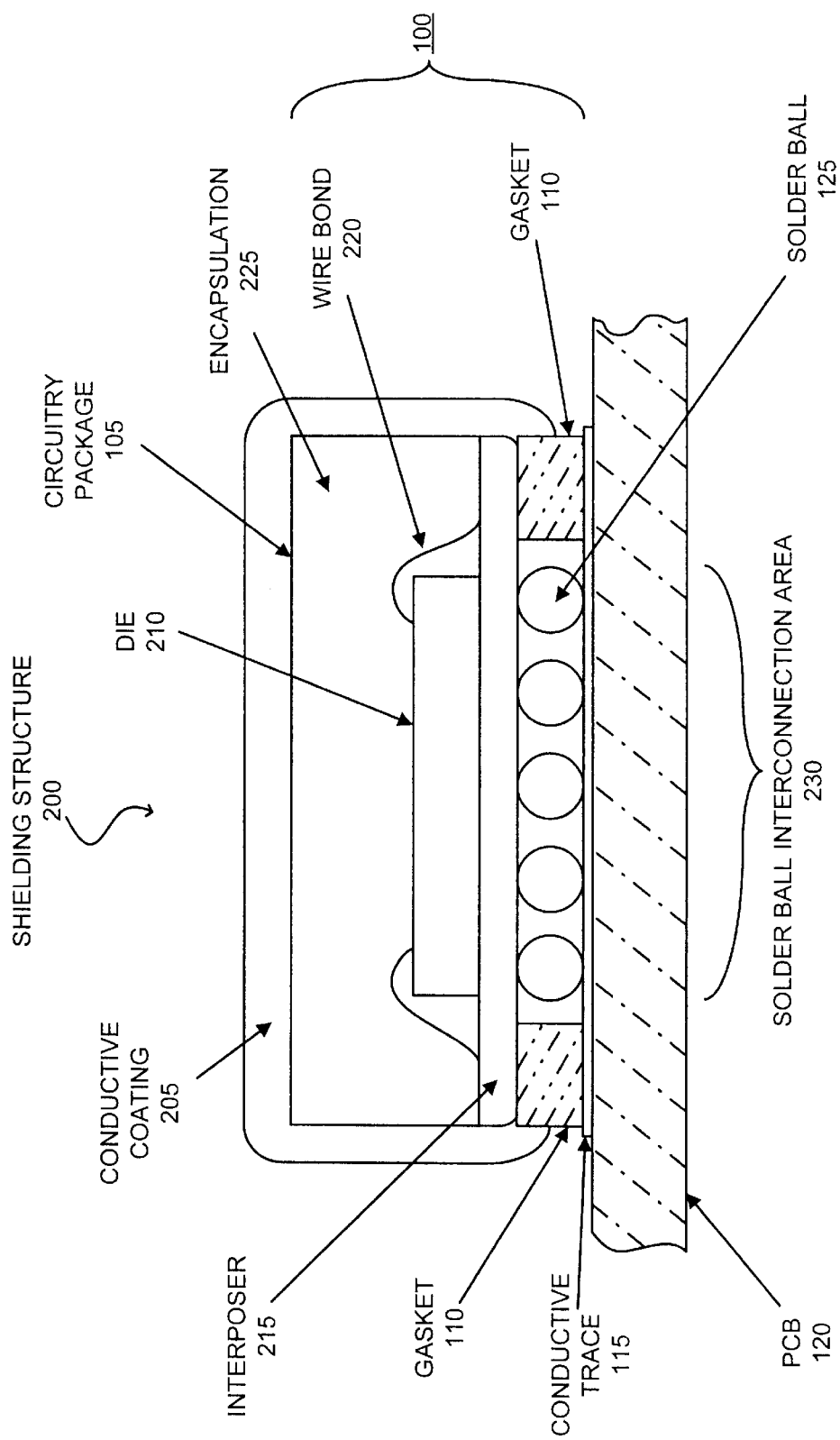
FIG. 2 illustrates a cut-away view of a shielding structure consistent with the present invention.

FIG. 2 illustrates a cut-away view of a shielding structure 200 consistent with the present invention. Shielding structure 200 may include a conductive coating 205 applied to structure 100. Coating 205 may be applied to form a continuous layer on areas of circuitry package 105 except for the solder ball interconnection area 230 under a bottom surface of circuitry package 105. Coating 205 may include a metal filled polymer such as, for example, a silver flake-filled fluoroelastomer. Shielding structure 200 may include a semiconductor die 210 bonded to interposer 215 using a wire bond 220. Interposer 215 may include a conventional organic material such as polyimide. Encapsulation 225 may be dispensed or molded over die 205 and interposer 220 to provide mechanical and/or environmental protection. Encapsulation 225 may, for example, include organic materials such as epoxies, polysulfones, or silicones. Interposer 215 may rest upon gasket 110 and solder balls 125 in solder ball interconnection area 230. Gasket 110 and solder balls 125 may further be positioned upon conductive trace 115, which, in turn, may be etched or applied to PCB 120.

Figure 3:
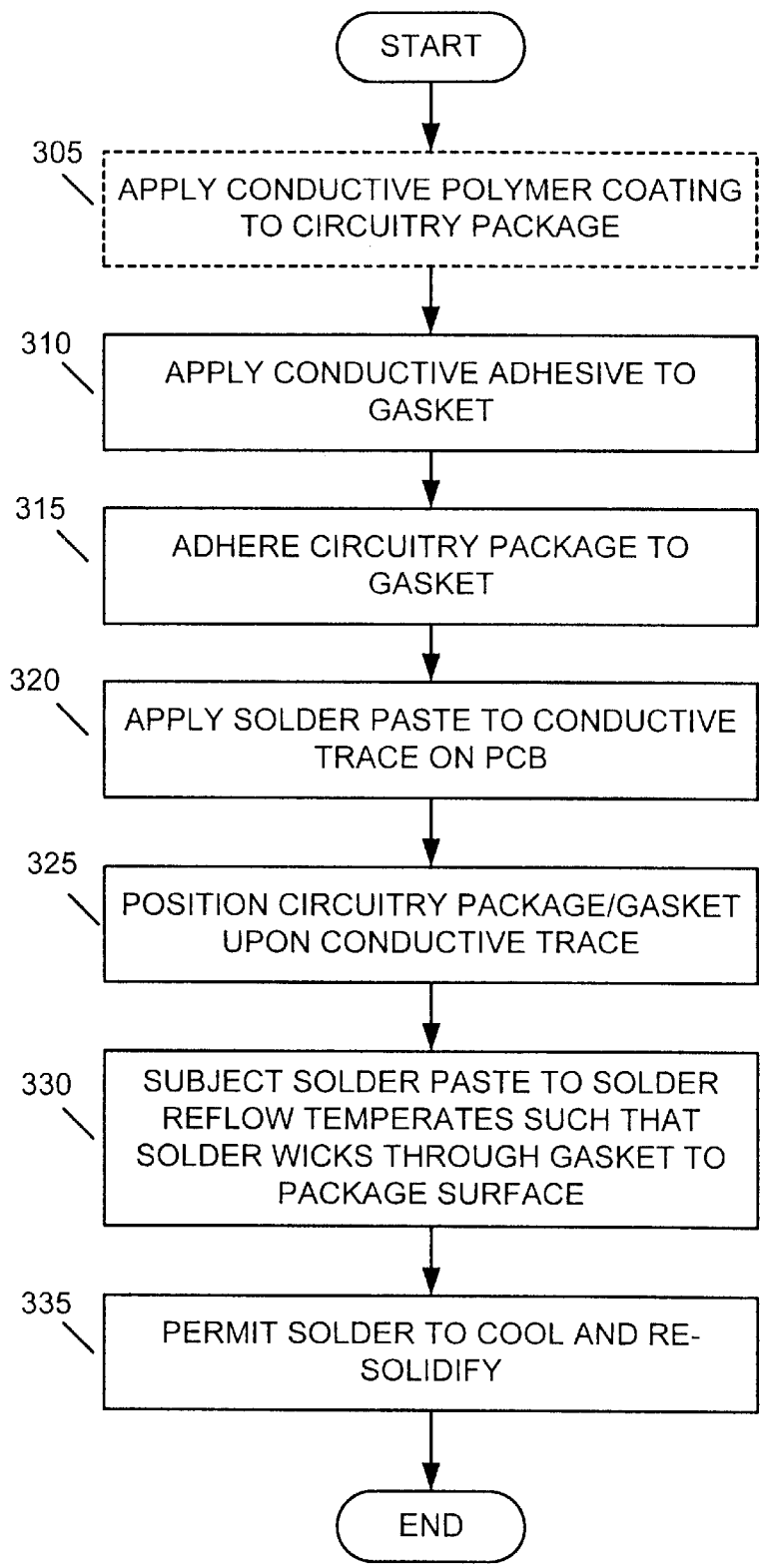
FIG. 3 illustrates an exemplary package shielding structure construction process consistent with the present invention.

FIG. 3 illustrates an exemplary flow diagram, consistent with the present invention, for constructing structure 100 or 200 consistent with the present invention. At optional step 305, conductive coating 205 can be applied to circuitry package 105. Conductive coating 205 may, for example, be applied by spraying or brushing the coating upon circuitry package 105. Conductive adhesive 130 may then be applied to a surface of gasket 110 [step 310]. Subsequent to application of conductive adhesive 130, circuitry package 105 may be adhered to gasket 110 [step 315] by pressing the two together.

Solder paste may then be applied to conductive trace 115 [step 320]. After application of the solder paste, the adhered circuitry package 105 and gasket 110 may be positioned upon conductive trace 115 [step 325]. The applied solder paste may then be heated to solder reflow temperatures such that solder wicks through gasket 110 to a lower surface of circuitry package 105 [step 330]. The heated solder paste may be permitted to cool and resolidify [step 335] to form a rigid solder filled gasket 110 that has enhanced structural integrity.

Implementations consistent with the present invention, thus, provide a shielding structure for a circuitry package by applying a coating of a metal filled polymer to surface areas of the circuitry package and, possibly, by providing an electrically conductive particle filled polymer gasket between the circuitry package and a conductive trace of the PCB. Implementations consistent with the present invention, therefore, provide a structure for shielding a circuitry package against EMI/RFI that may enhance the mechanical integrity of the interconnection between the circuitry package and the PCB.

The foregoing description of preferred embodiments of the present invention provides illustration and description, but is not intended to be exhaustive or to limit the invention to the precise form disclosed. Modifications and variations are possible in light of the above teachings or may be acquired from practice of the invention. Also, while series of steps have been described with regard to FIG. 3, the order of the steps may be varied in other implementations consistent with the present invention. No element, step, or instruction used in the description of the present application should be construed as critical or essential to the invention unless explicitly described as such.

The scope of the invention is defined by the claims and their equivalents.

What is claimed is:

1. A structure for interconnecting a circuitry package with a circuit board, comprising:
    a conductive trace applied to the circuit board;
    an electrically conductive particle filled polymer gasket; and
    a circuitry package adhered to the electrically conductive particle filled polymer gasket, wherein the gasket is soldered to the conductive trace such that solder wicks through the gasket to a surface of the circuitry package.

2. The structure of claim 1, wherein conductive particles of the conductive particle filled polymer gasket comprise at least one of silver, nickel, aluminum, copper, stainless steel, graphite, carbon, gold and platinum.

3. The structure of claim 1, wherein the polymer of the conductive particle filled polymer gasket comprises polytetrafluoroethylene (PTFE).

4. The structure of claim 1, further comprising:
    a layer of conductive polymer material coating at least a portion of the circuitry package.

5. The structure of claim 4, wherein the layer of conductive polymer material comprises a metal filled polymer.

6. The structure of claim 5, wherein the layer of metal filled polymer further comprises a silver particle-filled fluoroelastomer.

7. The structure of claim 1, wherein the circuitry package comprises a semiconductor die.

8. The structure of claim 7, wherein an organic encapsulant is molded over the semiconductor die.

9. The structure of claim 7, wherein the semiconductor die comprises integrated circuitry.

10. A method of shielding a circuitry package, comprising:
    applying a layer of conductive polymer material to at least a portion of the circuitry package, wherein the circuitry package comprises a semiconductor die, wherein the layer of conductive polymer material comprises a metal filled polymer, and wherein the metal filled polymer further comprises a silver particle filled fluoroelastomer; and
    adhering the circuitry package to an electrically conductive particle filled polymer gasket.

11. The method of claim 10, wherein the conductive particles of the conductive particle filled polymer gasket comprise at least one of silver, nickel, aluminum, copper, stainless steel, graphite, carbon, gold and platinum.

12. The method of claim 10, wherein the polymer of the conductive particle filled polymer gasket comprises polytetrafluoroethylene (PTFE).

13. The method of claim 10, further comprising:
    adhering the gasket to a conductive trace on a circuit board.

14. A method of interconnecting a circuitry package with a circuit board, comprising:
    applying a conductive trace to the circuit board;
    adhering the circuitry package to an electrically conductive particle filled polymer gasket;
    applying solder to the conductive trace; and
    applying heat to the solder such that the solder wicks from the conductive trace, through the gasket, to a surface of the circuitry package.

15. A structure for interconnecting a circuitry package with a circuit board, comprising:
    a conductive trace applied to the circuit board;
    an electrically conductive particle filled polymer gasket;
    a circuitry package adhered to the electrically conductive particle filled polymer gasket, wherein the gasket is soldered to the conductive trace such that the solder wicks through the gasket to a surface of the circuitry package; and
    a layer of conductive polymer material coating at least a portion of the circuitry package, wherein the layer of conductive polymer material comprises a silver particle-filled fluoroelastomer.

* * * * *